(12) United States Patent
Inagaki et al.

(10) Patent No.: US 11,054,190 B2
(45) Date of Patent: Jul. 6, 2021

(54) HEAT INSULATING STRUCTURE BODY

(71) Applicant: FURUKAWA ELECTRIC CO., LTD., Tokyo (JP)

(72) Inventors: Yoshikatsu Inagaki, Tokyo (JP); Hirofumi Aoki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 16 days.

(21) Appl. No.: 16/362,300

(22) Filed: Mar. 22, 2019

(65) Prior Publication Data

US 2019/0219219 A1 Jul. 18, 2019

Related U.S. Application Data

(63) Continuation of application No. PCT/JP2017/034537, filed on Sep. 25, 2017.

(30) Foreign Application Priority Data

Sep. 23, 2016 (JP) .............................. JP2016-186055

(51) Int. Cl.
*F28D 15/04* (2006.01)
*F28D 15/02* (2006.01)
*F25D 23/06* (2006.01)

(52) U.S. Cl.
CPC ........... *F28D 15/046* (2013.01); *F28D 15/02* (2013.01); *F28D 15/0275* (2013.01);
(Continued)

(58) Field of Classification Search
CPC .... F28D 15/0275; F28D 15/04; F28D 15/046; F28D 15/02; F28D 15/00
See application file for complete search history.

(56) References Cited

U.S. PATENT DOCUMENTS 9,293,072 B1 * 3/2016 Richert ................... G09F 19/00
2013/0092353 A1 * 4/2013 Yang ................... F28D 15/0233
165/104.26

(Continued)

FOREIGN PATENT DOCUMENTS

JP 2001-091172 A 4/2001
JP 2003-042674 A 2/2003
(Continued)

OTHER PUBLICATIONS

Japanese Office Action for Japanese Application No. 2018-540336, dated Jun. 24, 2019, with English translation.
(Continued)

*Primary Examiner* — Devon Russell
(74) *Attorney, Agent, or Firm* — Birch, Stewart, Kolasch & Birch, LLP

(57) ABSTRACT

A heat insulating structure body comprising:
a container which includes a first plate-like body, a second plate-like body facing the first plate-like body, a partition plate for dividing a space between the first plate-like body and the second plate-like body, a first cavity part formed by the first plate-like body and the partition plate, and a second cavity part formed by the second plate-like body and the partition plate,
wherein a wick structure body and a working fluid are sealed in the second cavity part.

6 Claims, 8 Drawing Sheets

(52) U.S. Cl.
CPC ............ *F28D 15/04* (2013.01); *F25D 23/064* (2013.01); *F25D 23/065* (2013.01)

(56) References Cited

U.S. PATENT DOCUMENTS

| | | | |
|---|---|---|---|
| 2014/0157605 A1* | 6/2014 | Hsieh ................. | A47G 23/0313 30/165 |
| 2014/0174704 A1* | 6/2014 | Lin ....................... | H01L 23/427 165/185 |
| 2015/0000866 A1* | 1/2015 | Lin ..................... | F28D 15/0233 165/67 |
| 2015/0176916 A1* | 6/2015 | Pai ....................... | F28D 15/046 165/104.26 |
| 2019/0207278 A1* | 7/2019 | Kuboki ................. | H01G 11/82 |

FOREIGN PATENT DOCUMENTS

| | | | | |
|---|---|---|---|---|
| JP | 2004-238672 A | | 8/2004 | |
| JP | 2006087912 A | * | 4/2006 | ............ F28D 15/02 |
| JP | 2006-275188 A | | 10/2006 | |
| JP | 2008-153423 A | | 7/2008 | |
| JP | 2008-311399 A | | 12/2008 | |
| JP | 2009-229764 A | | 10/2009 | |
| JP | 2010-190257 A | | 9/2010 | |
| JP | 2011-122610 A | | 6/2011 | |
| JP | 2011-220620 A | | 11/2011 | |
| JP | 2013-170652 A | | 9/2013 | |
| JP | 2015-14326 A | | 1/2015 | |
| JP | 2016-035357 A | | 3/2016 | |

OTHER PUBLICATIONS

International Search Report for PCT/JP2017/034537 (PCT/ISA/210) dated Dec. 12, 2017.
Written Opinion of the International Searching Authority for PCT/JP2017/034537 (PCT/ISA/237) dated Dec. 12, 2017.
International Preliminary Report on Patentability and English Translation of the Written Opinion of the International Searching Authority for PCT/JP2017/034537 dated Mar. 26, 2019 (Forms PCT/IB/373 and PCT/ISA/237).
First Notification of Correction dated Aug. 27, 2019, in corresponding Chinese Application No. 201790001074.4, with English translation.
Japanese Office Action dated Oct. 23, 2019, issued in corresponding Japanese Patent Application No. 2018-540336, with English translation.
Notification to grant Utility Patent dated Sep. 24, 2019, in corresponding Chinese Application No. 201790001074.4, with English translation.
Decision to grant a patent dated Feb. 3, 2020 for corresponding Japanese application No. 2018-540336.

* cited by examiner

HEAT INSULATING STRUCTURE BODY

CROSS REFERENCE TO RELATED APPLICATIONS

The present application is a continuation application of International Patent Application No. PCT/JP2017/034537 filed on Sep. 25, 2017, which claims the benefit of Japanese Patent Application No. 2016-186055, filed on Sep. 23, 2016. The contents of these applications are incorporated herein by reference in their entirety.

BACKGROUND

Technical Field

The present disclosure relates to a heat insulating structure body having an internal space under a reduced pressure.

Background

In recent years, with size reductions and increases in functions of electronic devices such as smart phones and personal computers, electronic components mounted on the electronic device have been generating an increasing amount of heat. Even the above-described electronic components are required to be surely cooled by a heat transfer member. The heat transfer member may be further provided with a heat insulating material at and near a portion touched by a person, or at and near a portion on which a component vulnerable to heat is mounted, to prevent the heat of the electronic components from being transferred to such a portion.

As the above-described heat insulating material, a vacuum heat insulating material having good heat insulating effect may be used, for example, the good heat insulating effect being obtained by removing air having a heat transfer action as much as possible. Examples of a structure including a heat transfer member and a vacuum heat insulating material include a structure in which a fibrous material such as a silica fiber serving as a core material is covered with a laminate film, ends of the laminate film are then sealed to keep the inside of the laminate film under vacuum, and a vacuum heat insulating material thus formed is laminated on the heat transfer member such as aluminum and a graphite sheet (see Japanese Patent Laid-Open No. 2015-14326). Note that the core material is a reinforcement member for maintaining a vacuum space.

In Japanese Patent Laid-Open No. 2015-14326, as a member having a cooling action, a member such as aluminum and a graphite sheet having the heat conductivity is used, resulting that the heat transfer function cannot be sufficiently obtained. Therefore, the cooling effect is insufficient to the electronic component, etc. with an increased amount of heat generated. In Japanese Patent Laid-Open No. 2015-14326, the core material is filled into the vacuum space of the vacuum heat insulating material, resulting that the heat insulating effect of the vacuum heat insulating material may be reduced due to the core material.

SUMMARY

The present disclosure is related to providing a heat insulating structure body capable of exerting an excellent heat insulating effect on a to-be-cooled body with a large amount of heat generated, and having an excellent heat transfer properties to thereby exert an excellent cooling effect.

According to one aspect of the present disclosure, a heat insulating structure body includes a container which includes a first plate-like body, a second plate-like body facing the first plate-like body, a partition plate for dividing a space between the first plate-like body and the second plate-like body, a first cavity part formed by the first plate-like body and the second plate-like body, and a second cavity part formed by the second plate-like body and the partition plate, wherein a wick structure body and a working fluid are sealed in the second cavity part.

In the above-described aspect, the working fluid is sealed in the second cavity part, and the wick structure body is housed in the second cavity part, so that the second cavity part functions as a vapor chamber (planar heat pipe).

In an aspect of the present disclosure, in the heat insulating structure body, a post part is further provided in the first cavity part.

In an aspect of the present disclosure, in the heat insulating structure body, the post part is a porous body.

In an aspect of the present disclosure, in the heat insulating structure body, each of the first plate-like body, the second plate-like body, and the partition plate is one metal plate-like body, and the first plate-like body, the second plate-like body, and the partition plate are integrally formed by thermal welding.

In an aspect of the present disclosure, in the heat insulating structure body, a thermal conductivity of the second plate-like body is higher than a thermal conductivity of the first plate-like body.

In an aspect of the present disclosure, in the heat insulating structure body, the first plate-like body is made of a thermoplastic resin.

In an aspect of the present disclosure, in the heat insulating structure body, the first cavity part has a reduced pressure.

In an aspect of the present disclosure, the heat insulating structure body includes the first cavity part serving as a space part, thereby exerting the excellent heat insulating effect. Thus, the first cavity part of the present disclosure has the excellent heat insulating performance, thereby capable of preventing the heat from being transferred from the heating element serving as a to-be-cooled body to a portion touched by a person or a portion on which a component vulnerable to heat is mounted, and thus enabling temperature increase of such a portion to be suppressed. In an aspect of the present disclosure, in the second cavity part of the container, the wick structure body is housed and the working fluid is sealed, the second cavity part functioning as a vapor chamber, thereby having the excellent heat transfer properties, and thus enabling the excellent cooling effect to be exerted.

In an aspect of the present disclosure, the thermal conductivity of the second plate-like body is higher than the thermal conductivity of the first plate-like body, thereby capable of providing the heat insulating structure body with the excellent heat transfer effect (i.e., cooling effect of the to-be-cooled body) and the excellent heat insulating performance against the to-be-cooled body.

In an aspect of the present disclosure, the first cavity part has a reduced pressure, thereby further improving the heat insulating performance.

DETAILED DESCRIPTION

Figure 1:
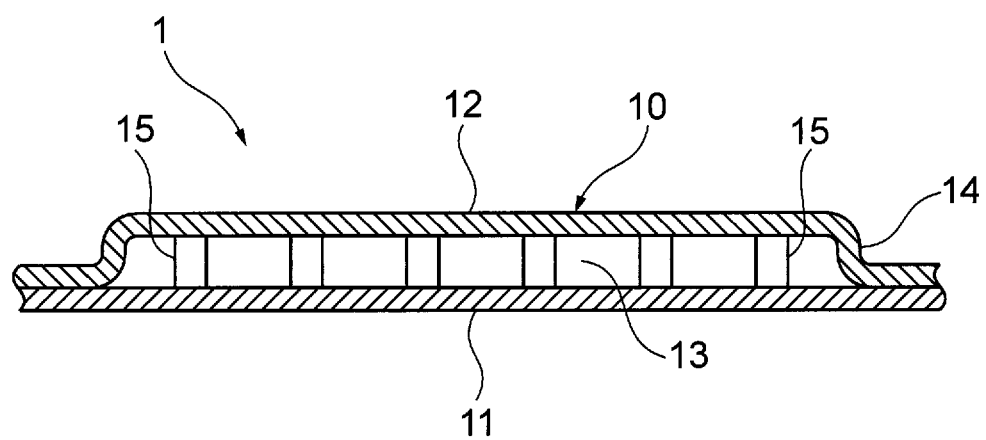
FIG. 1 is a cross-sectional side view of a heat insulating material used for a heat insulating structure body according to a first embodiment of the present disclosure.

Hereinafter, a heat insulating material used for a heat insulating structure body according to a first embodiment of the present disclosure will be described with reference to the accompanying drawings. As illustrated in FIG. 1, a heat insulating material 1 used for the heat insulating structure body according to the first embodiment of the present disclosure includes a container 10 in which a protruding part 14 having a cavity part 13 is formed, and post parts 15 provided in the cavity part 13. An outer periphery of the cavity part 13 is sealed by thermal welding.

The container 10 of the heat insulating material 1 is formed by overlapping two metal plate-like bodies facing each other, i.e., one plate-like body 11 and another plate-like body 12. In the heat insulating material 1, the container 10 has a rectangular shape in a plan view, and is provided with the protruding part 14 having the cavity part 13 at a center of the container 10. The inside of the cavity part 13 is evacuated to be kept under reduced pressure. In the heat insulating material 1, the inside of the cavity part 13 is evacuated to produce a vacuum state. Thus, the cavity part 13 of the container 10 is depressurized (in the heat insulating material 1, the cavity part 13 is decompressed to the vacuum state), resulting in gas (air) having a heat transfer action being removed.

The one plate-like body 11 has a flat plate shape. The other plate-like body 12 also has a flat plate shape, and the center of the plate-like body 12 is plastically deformed to have a protruding shape. A portion of the other plate-like body 12 which protrudes outward and is plastically deformed to have a protruding shape is the protruding part 14 of the container 10. The inside of the protruding part 14 is the cavity part 13.

The thickness of the one plate-like body 11 and the thickness of the other plate-like body 12 are not limited to particular values, and are preferably 0.05 to 1.0 mm, and particularly preferably 0.1 to 0.4 mm from the viewpoint of more surely keeping the cavity part under reduced pressure while exhibiting the excellent rigidity. The material of the one plate-like body 11 and the material of the other plate-like body 12 are not limited to particular materials, and include, for example, stainless, copper, a copper alloy such as cupronickel, aluminum, an aluminum alloy, iron, tin, nickel, a nickel alloy, titanium, and a titanium alloy. Among these, stainless is preferable from the viewpoint of having the rigidity, easily ensuring the flatness, and showing excellent resin moldability.

The post parts 15 are provided in the cavity part 13. The post parts 15 are members for keeping the cavity part 13 under the reduced pressure. Therefore, portions other than the post parts 15 in the cavity part 13 are space portions. The positions of the post parts 15 are not limited to particular positions, but in the heat insulating material 1, the post parts 15 are disposed at both ends and center of the cavity part 13. Note that working fluid such as water is not sealed in the cavity part 13.

The cross-sectional shape of the post part 15 in a side view is not limited to a particular shape, but in the heat insulating material 1, the post part 15 has a rectangular column shape. The material of the post part is not limited to a particular material, and includes, for example, a metal (e.g., copper, a copper alloy, etc.) porous body, a metal mesh made of copper, a copper alloy, etc., resin, and ceramic.

In the heat insulating material 1, the one plate-like body 11 is thermally welded to an outer periphery of the cavity part 13, that is, the one plate-like body 11 is thermally welded with the other plate-like body 12 to surround an outer periphery of the cavity part 13. Thus, the outer periphery of the cavity part 13 is thermally welded, resulting that the cavity part 13 is sealed and airtightness is provided in the cavity part 13. The thermal welding method is not limited to a particular method, and includes, for example, a welding method such as laser welding, resistance welding, etc.

In the heat insulating material 1, portions other than the post parts 15 in the cavity part 13 of the container 10 are space portions, and the space portions are decompressed so that gas such as air having the heat conductivity is reduced or eliminated. Accordingly, the cavity part 13 exerts the excellent heat insulating effect. Thus, the heat insulating material 1 exerts the excellent heat insulating effect, so that even when a heating element is installed in a narrow space, the heat insulating material 1 is disposed between a portion touched by a person or a portion on which a component vulnerable to heat is mounted and the heating element, thus enabling temperature increase of the above-described portion to be suppressed. The heat insulating material 1 formed of the two metal plate-like bodies facing each other, resulting in an increase in the rigidity, can be attached to a predetermined attachment site using a fixing member such as a screw. The heat insulating material 1 can be processed into a desired shape by plastic deformation such as bending, to thereby be easily attached to a narrow and complicated space, for example, a circuit board on which electronic component is mounted.

Next, a heat insulating structure body using the above-described heat insulating material 1 will be described with reference to the accompanying drawings. Here, a case is described as an example where the heat insulating structure body is installed to an electronic component (for example, a central processing unit (CPU)) housed in a housing of a personal computer.

Figure 2A:
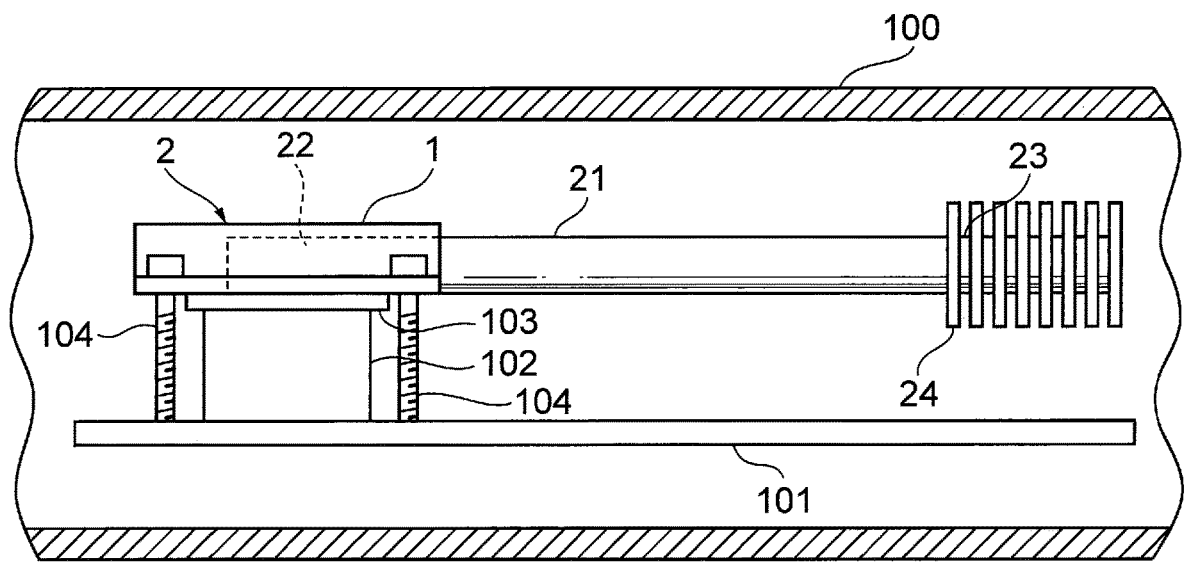
FIG. 2A is a side view of the heat insulating structure body according to the first embodiment of the present disclosure.
Figure 2B:
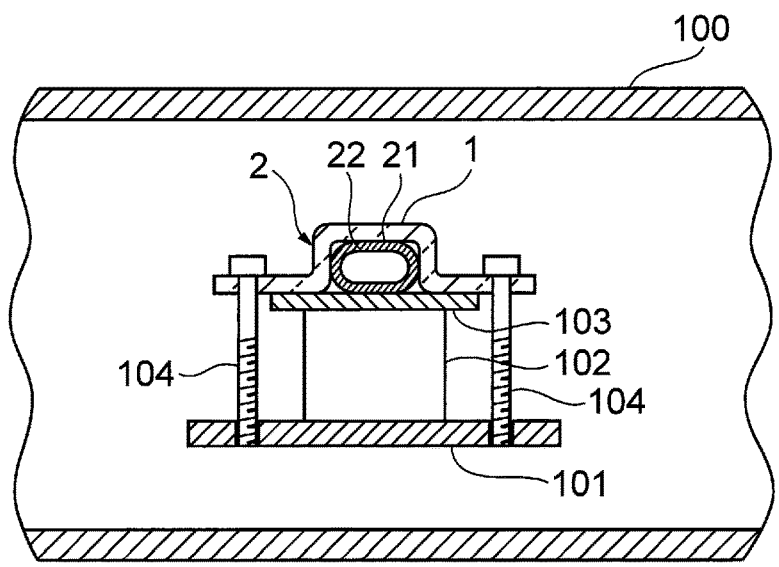
FIG. 2B is an elevational sectional view of the heat insulating structure body according to the first embodiment of the present disclosure.

As illustrated in FIGS. 2A and 2B, a heat insulating structure body 2 according to the first embodiment of the present disclosure includes the above-described heat insulating material 1 and a heat pipe 21, the heat insulating material 1 and the heat pipe 21 being housed in a housing 100 of the personal computer. The heat pipe 21 is thermally connected to an electronic component 102 (a heating element serving as a to-be-cooled body). An evaporation part 22 of the heat pipe 21 receives heat from the electronic component 102 mounted on the circuit board 101 through a heat-receiving plate 103, and the heat received by the evaporation part 22 is transferred from the evaporation part 22 to a condensation part 23 of the heat pipe 21. The heat transferred to the condensation part 23 is discharged outside the heat pipe 21 from the condensation part 23 through a heat dissipation fin 24 serving as a heat exchanging unit, so that the electronic component 102 is cooled.

In the heat insulating structure body 2, a container of the heat pipe 21 is a tubular body. The heat insulating material 1 of the heat insulating structure body 2 is a flat plate which is formed by overlapping two metal plate-like bodies facing each other, resulting in an increase in the rigidity, so that the heat insulating material 1 can be subjected to a bending process (in the figure, processed in a recessed shape). The heat pipe 21 is fitted to a recessed part of the heat insulating material 1, so that the heat pipe 21 is fixed to the heat insulating material 1. Accordingly, in the heat insulating structure body 2, the heat insulating material 1 is in a state of direct contact with the heat pipe 21. In the heat insulating structure body 2, the heat insulating material 1 is subjected to the bending process to have a recessed shape, to thereby exhibit the excellent fixation to the heat pipe 21 having the container of a tubular body.

The heat insulating material 1 and the electronic component 102 serving as a to-be-cooled body are disposed to face each other through the heat pipe 21. Accordingly, the evaporation part 22 of the heat pipe 21 is fitted to the recessed part of the heat insulating material 1. As described above, the heat insulating material 1 has the excellent heat insulating performance with respect to the evaporation part 22 of the heat pipe 21 and the electronic component 102. An installation region of the heat insulating material 1 in the housing 100 is not limited to a particular region, and is preferably in a range of 10 to 80% with respect to a surface of the housing 100, and particularly preferably in a range of 15 to 50%.

As illustrated in FIGS. 2A and 2B, the heat insulating material 1 is fixed (in the figures, by screwing) to the circuit board 101 on which the electronic component 102 is mounted by fixing units (in the figures, screws 104). Thus, the heat insulating material 1 of the heat insulating structure body 2 is a flat plate having the rigidity, thereby capable of providing threaded holes for screwing.

The heat insulating structure body 2 includes the heat pipe 21 having the excellent heat transfer efficiency (i.e., cooling efficiency), and the heat insulating material 1 having the excellent heat insulating performance, and therefore is a heat insulating structure body excellent in the heat insulating performance and the heat transfer properties.

Next, a heat insulating structure body according to a second embodiment of the present disclosure will be described with reference to the accompanying drawings. Note that the same reference numerals are used for the same components as the heat insulating structure body according to the first embodiment.

Figure 3:
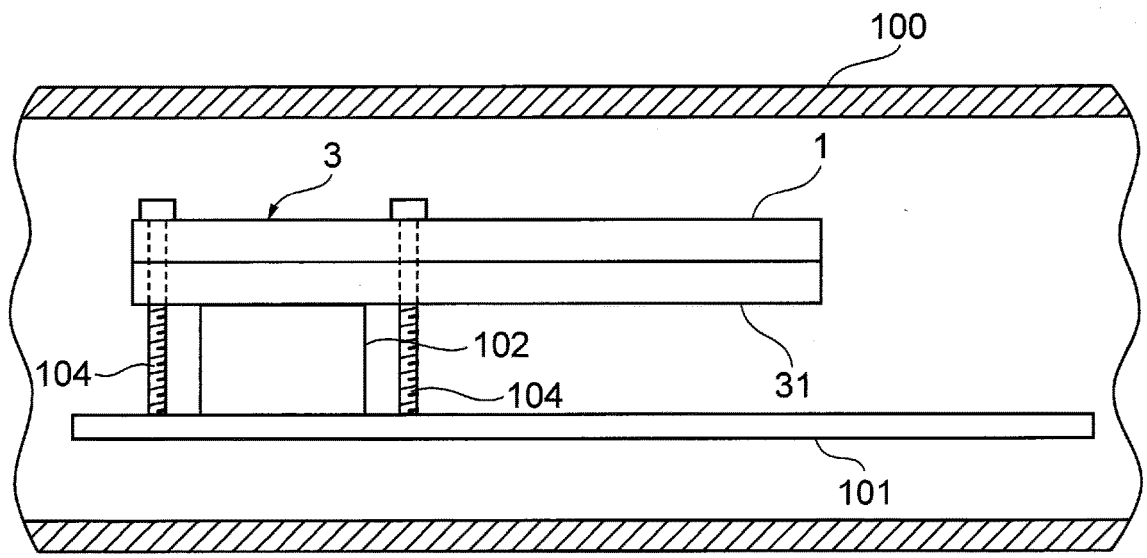
FIG. 3 is a diagram illustrating a heat insulating structure body according to a second embodiment of the present disclosure.
Figure 4:
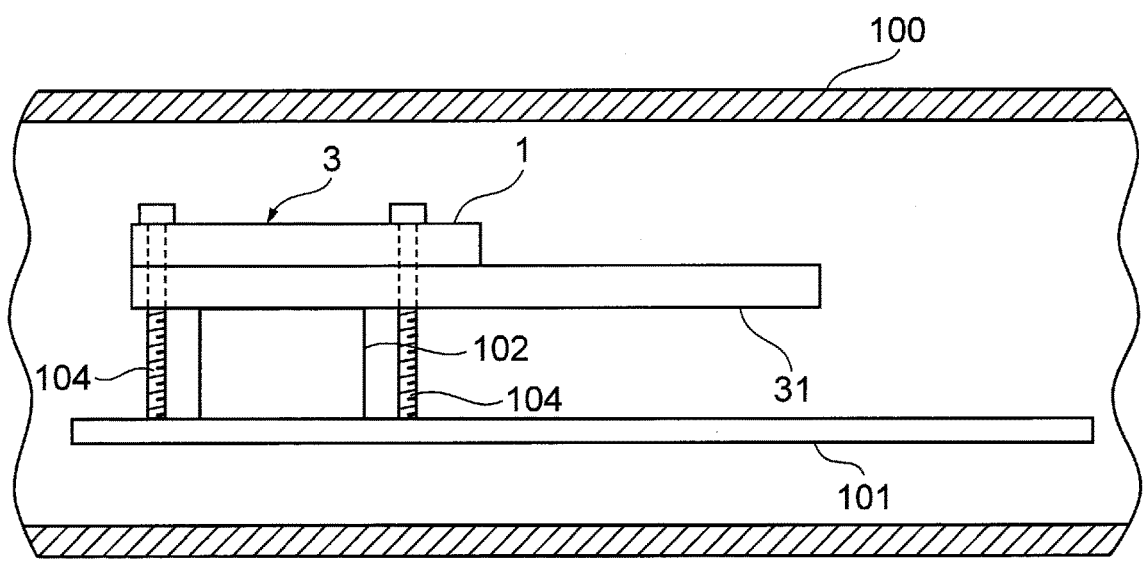
FIG. 4 is a diagram illustrating the heat insulating structure body according to the second embodiment of the present disclosure.

As illustrated in FIGS. 3 and 4, in a heat insulating structure body 3 according to the second embodiment of the present disclosure, a planar heat pipe (vapor chamber) 31 is used instead of the heat pipe having a container of a tubular body, of the heat insulating structure body according to the first embodiment. That is, in the heat insulating structure body 3 according to the second embodiment, the heat insulating material 1 functions as a heat insulating member for the planar heat pipe 31.

In the heat insulating structure body 3, the planar heat pipe 31 is used, and therefore the heat insulating material 1 is not bent in a recessed shape. The heat insulating material 1 is laminated on the planar heat pipe 31 in a direct contact with one another. In the heat insulating structure body 3 illustrated in FIG. 3, the shape and area of the heat insulating material 1 in the plan view are substantially equal to those of the planar heat pipe 31 in the plan view, and the heat insulating material 1 is disposed directly above the heating element 102, and extends outside the heating element 102. On the other hand, in the heat insulating structure body 3 illustrated in FIG. 4, the area of the heat insulating material 1 in the plan view is smaller than the area of the planar heat pipe 31 in the plan view, and the heat insulating material 1 is disposed only directly above the heating element 102. The planar heat pipe 31 is interposed between the planar heat insulating material 1 which is not subjected to the bending process and the electronic component 102, and is fixed in place. The heat insulating material 1 is a flat plate which is formed of the two metal plate-like bodies facing each other in the similar manner as the planar heat pipe 31, and therefore can be fixed to the circuit board 101 together with the planar heat pipe 31 using the fixing units such as screws 104 without providing the recessed part. In the heat insulating structure body 3, the heat insulating material 1 has the excellent heat insulating performance with respect to the planar heat pipe 31 and the electronic component 102 in the similar manner as the heat insulating structure body according to the first embodiment.

Next, a heat insulating structure body according to a third embodiment of the present disclosure will be described with reference to the accompanying drawings. Note that the same reference numerals are used for the same components as the heat insulating structure bodies according to the first embodiment and the second embodiment.

Figure 5:
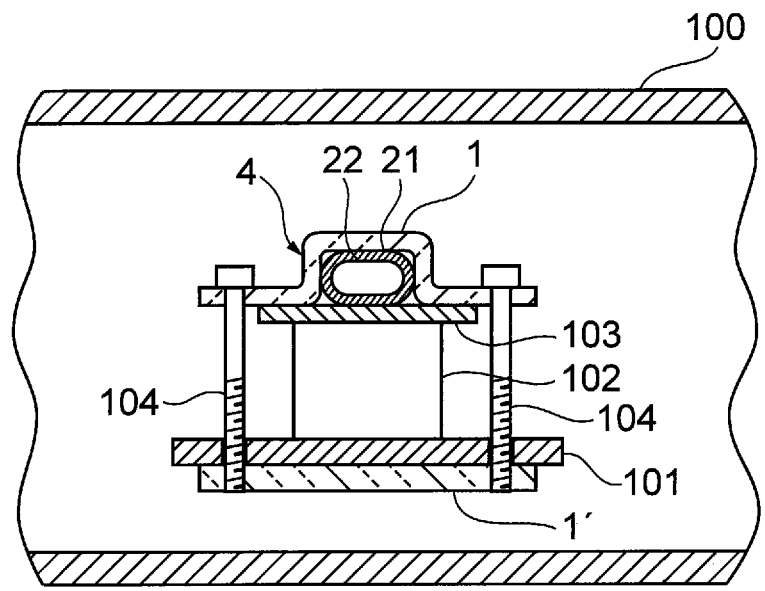
FIG. 5 is a diagram illustrating a heat insulating structure body according to a third embodiment of the present disclosure.

As illustrated in FIG. 5, in a heat insulating structure body 4 according to the third embodiment of the present disclosure, another heat insulating material 1' having the same member as the heat insulating material 1 is further provided on a back surface side of the circuit board 101, that is, a surface side on which the electronic component 102 is not mounted, in addition to the above-described heat insulating structure body according to the first embodiment. More specifically, in the heat insulating structure body 4 according to the third embodiment, the other heat insulating material 1' which is provided on the back surface side of the circuit board 101 functions as a heat insulating member and a reinforcement member with respect to the circuit board 101.

The other heat insulating material 1' is fixed (in the figures, by screwing) to the circuit board 101 together with the heat insulating material 1 by fixing units (in the figures, screws 104) in a state of direct contact with the back surface of the circuit board 101. The other heat insulating material 1' is fixed in a state of direct contact with the back surface of the circuit board 101, to thereby have a planar shape without being subjected to the bending process.

The other heat insulating material 1' has a planar shape and the rigidity, and therefore functions as a reinforcement member with respect to the circuit board 101 even when a stress is applied to the circuit board 101, thereby causing deflection.

Next, a heat insulating structure body according to a fourth embodiment of the present disclosure will be described with reference to the accompanying drawings. Note that the same reference numerals are used for the same components as the heat insulating structure bodies according to the first embodiment to the third embodiment.

Figure 6:
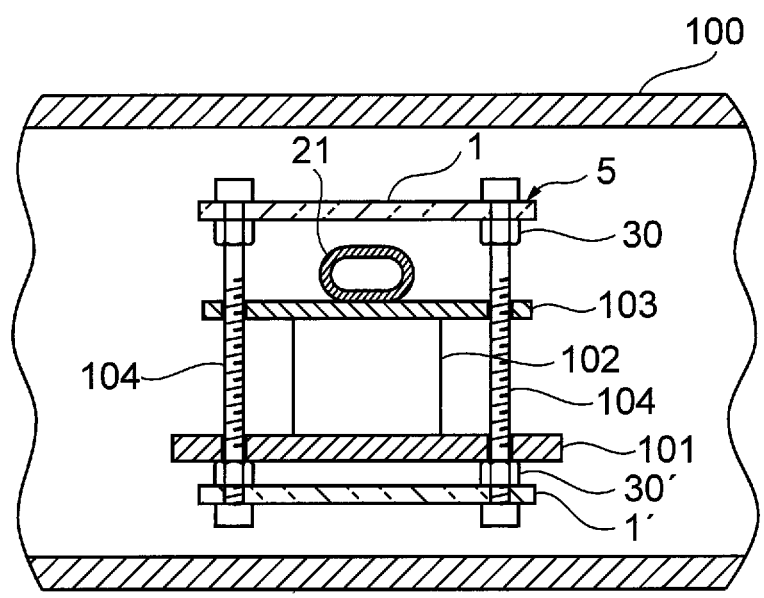
FIG. 6 is a diagram illustrating a heat insulating structure body according to a fourth embodiment of the present disclosure.

As illustrated in FIG. 6, in a heat insulating structure body 5 according to the fourth embodiment of the present disclosure, a spacer 30 is further provided between the heat pipe 21 of the heat insulating structure body according to the third embodiment and the heat insulating material 1. More specifically, in the heat insulating structure body 5 according to the fourth embodiment, the heat pipe 21 is not in direct contact with the heat insulating material 1.

In the heat insulating structure body 5, the spacer 30 is a nut, and the nut serving as the spacer 30 is screwed into a screw groove of the screw 104 serving as a fixing unit of the heat insulating material 1. The heat insulating material 1 is fixed to the circuit board 101 without contacting the heat pipe 21 having the container of a tubular body, to thereby have a planar shape without being subjected to the bending process.

Note that in the heat insulating structure body 5, another spacer 30' is also provided between the circuit board 101 and the other heat insulating material 1'. Accordingly, the circuit board 101 is not in direct contact with the other heat insulating material 1'. The other spacer 30' is a nut in the similar manner as the spacer 30, and is screwed in the screw groove of the screw 104.

In the heat insulating structure body 5, the spacers 30 are disposed between the heat pipe 21 and the heat insulating material 1, thereby capable of providing a distance between the heat insulating material 1 and the electronic component 102 (a heating element serving as a to-be-cooled body), resulting that the heat insulating material 1 has the excellent heat insulating performance with respect to the heat pipe 21 and the electronic component 102.

Next, a heat insulating structure body according to a fifth embodiment of the present disclosure will be described with reference to the accompanying drawings. Note that the same reference numerals are used for the same components as the heat insulating structure bodies according to the first embodiment to the fourth embodiment.

Figure 7:
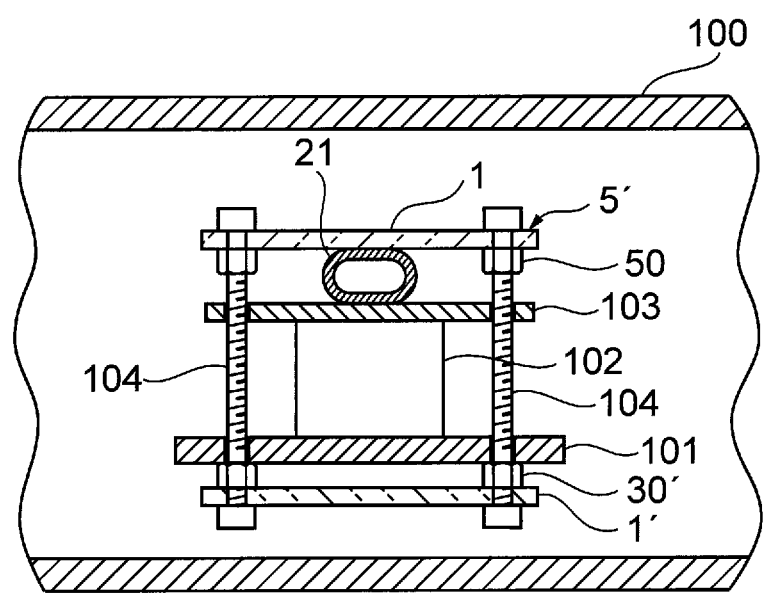
FIG. 7 is a diagram illustrating a heat insulating structure body according to a fifth embodiment of the present disclosure.

In the heat insulating structure body according to the fourth embodiment, the nut acts as a spacer so that the heat pipe is not in direct contact with the heat insulating material. Alternatively, in the heat insulating structure body 5' according to the fifth embodiment, a nut 50 is disposed on the screw 104 so that the heat pipe 21 directly contacts the heat insulating material 1, as illustrated in FIG. 7. More specifically, the nut 50 positions the heat insulating material 1 so that the heat pipe 21 directly contacts the heat insulating material 1.

As in the heat insulating structure body 5', the planar heat insulating material 1 which is not subjected to the bending process may be fixed to the circuit board 101 in a state of contact with the heat pipe 21 having the container of a tubular body.

Next, a heat insulating structure body according to a sixth embodiment of the present disclosure will be described with reference to the accompanying drawings. Note that the same reference numerals are used for the same components as the heat insulating structure bodies according to the first embodiment to the fifth embodiment.

Figure 8A:
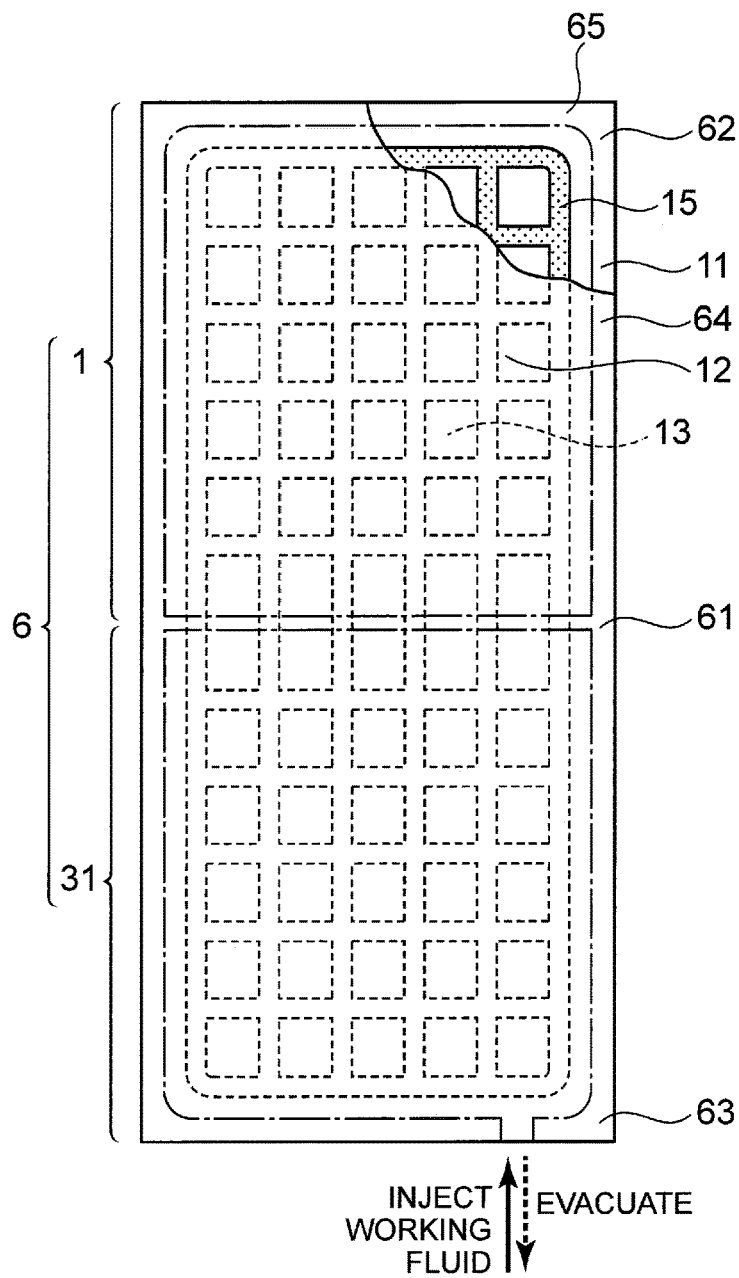
FIG. 8A is a plan view of a heat insulating structure body according to a sixth embodiment of the present disclosure.

In the above-described heat insulating structure bodies according to the first to fifth embodiments, the heat insulating material is provided separately from the heat pipe. Alternatively, as illustrated in FIGS. 8A and 8C, in a heat insulating structure body 6 according to the sixth embodiment of the present disclosure, the heat insulating material 1 is provided integrally with the heat pipe 31. More specifically, in two metal plates 64, 65 facing each other, a portion from a center 61 to one end 62 functions as two metal plate-like bodies facing each other in the heat insulating material 1 (i.e., one plate-like body 11 and the other plate-like body 12), and a portion from the center 61 to the other end 63 functions as a container of the planar heat pipe 31.

In the heat insulating structure body 6, the portion of the heat insulating material 1 and the portion of the planar heat pipe 31 are formed with the center 61 serving as a boundary. At the center 61, the two metal plates 64, 65 facing each other are sealed by thermal welding. Therefore, the internal space of the heat insulating material 1 and the internal space of the planar heat pipe 31 are not in communication with each other.

Figure 8B:
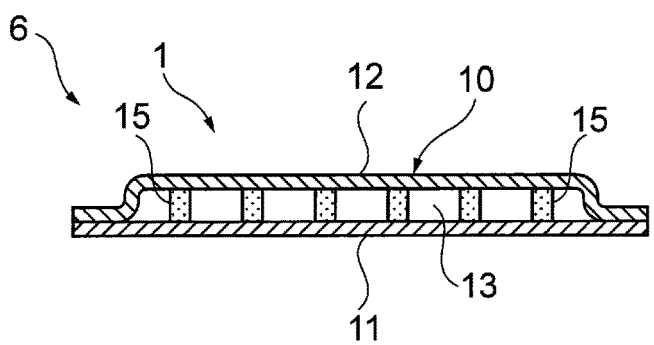
FIG. 8B is an elevational sectional view of a portion of a heat insulating material of the heat insulating structure body according to the sixth embodiment of the present disclosure.
Figure 8C:
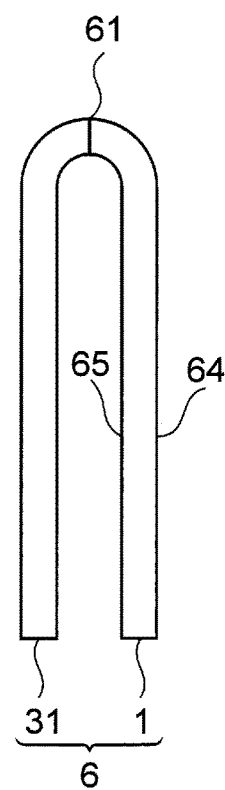
FIG. 8C is a cross-sectional side view of a mode of use of the heat insulating structure body according to the sixth embodiment of the present disclosure.

As illustrated in FIG. 8B, a post part 15 is disposed in the portion of the heat insulating material 1. The post part 15 is, for example, a metal mesh, or a metal porous body made of a metal sintered body made by sintering metal powders such as copper powders. The post part 15 has a wick structure body causing a capillary force. The shape of the post part 15 in the plan view is not limited to a particular shape, but in the heat insulating structure body 6, the post part 15 has a lattice pattern as illustrated in FIG. 8A. The post part 15 is disposed between the two metal plates 64, 65 facing each other.

The post part 15 is also disposed in the portion of the planar heat pipe 31 in the similar manner as the portion of the heat insulating material 1. As described above, the post part 15 has a wick structure body causing a capillary force, and therefore in the portion of the planar heat pipe 31, the post part 15 functions as a wick structure body so that the working fluid which has changed its phase from gas to liquid at the condensation part flows back to the evaporation part.

As illustrated in FIG. 8C, in the heat insulating structure body 6, by bending at the center 61, for example, the portion of the heat insulating material 1 has the excellent heat insulating performance with respect to the portion of the planar heat pipe 31, and the electronic component (not illustrated) which is thermally connected to the portion of the planar heat pipe 31. In the heat insulating structure body 6, the portion of the heat insulating material 1 is formed integrally with the portion of the planar heat pipe 31, to thereby exhibit the excellent fixation to the portion of the planar heat pipe 31.

Next, a heat insulating structure body according to a seventh embodiment of the present disclosure will be described with reference to the accompanying drawings. Note that the same reference numerals are used for the same components as the heat insulating structure bodies according to the first embodiment to the sixth embodiment.

In the heat insulating structure body according to the sixth embodiment, the two metal plates facing each other are sealed by thermal welding at the center serving as a boundary, so that the portion of the heat insulating material is formed integrally with the portion of the planar heat pipe (vapor chamber). Alternatively, in a heat insulating structure body 7 according to the seventh embodiment, a partition plate 70 for dividing a space between one plate-like body 11 and another plate-like body 12 is provided between the two plate-like bodies facing each other, that is, between the one plate-like body 11 as a second plate-like body and the other plate-like body 12 as a first plate-like body facing the one plate-like body 11, as illustrated in FIG. 9.

In the heat insulating structure body 7, not only the center of the other plate-like body (first plate-like body) 12 but also the center of the one plate-like body (second plate-like body) 11 is plastically deformed to have a protruding shape. The portion extending outward and plastically deformed to have a protruding shape, of the one plate-like body 11 is a protruding part of the container 10. The inside of the protruding part is a second cavity part 72 described later.

In the heat insulating structure body 7, the container 10 is comprised of the other plate-like body (first plate-like body) 12, the other plate-like body (second plate-like body) 11, and a partition plate 70 having a flat plate shape. Each of the first plate-like body 12, the second plate-like body 11 and the partition plate 70 is formed from one plate-like body (i.e., a single plate). In the heat insulating structure body 7, a thermal welded portion located at an outer periphery of the container 10 has a three-layer structure including the other plate-like body (first plate-like body) 12, the partition plate 70 having a flat plate shape, and the one plate-like body (second plate-like body) 11.

Figure 9:
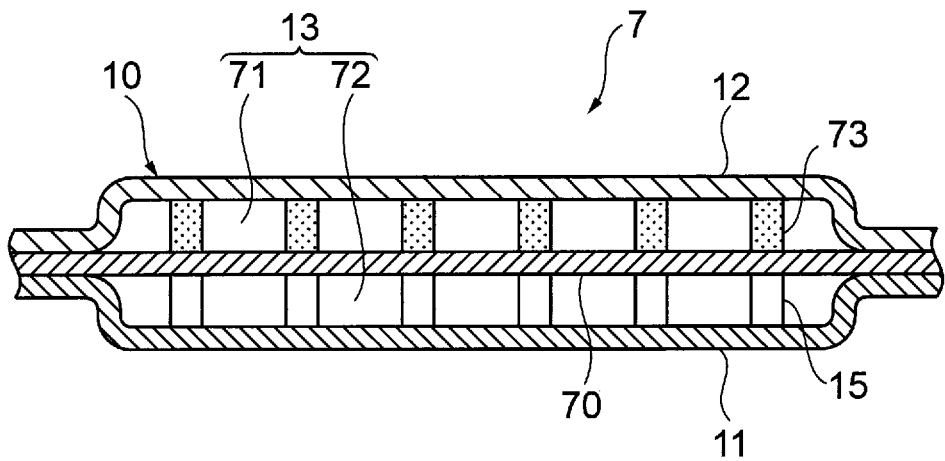
FIG. 9 is a diagram illustrating a heat insulating structure body according to a seventh embodiment of the present disclosure.

As illustrated in FIG. 9, the partition plate 70 extends along a planar direction of the one plate-like body 11 and a planar direction of the other plate-like body 12, so as to divide the internal space of the container 10 into two regions. More specifically, a cavity part 13 of the container 10 is divided by the partition plate 70 into a first cavity part 71 formed between the other plate-like body (first plate-like body) 12 and the partition plate 70 and a second cavity part 72 formed between the one plate-like body (second plate-like body) 11 and the partition plate 70. Accordingly, a portion of the container 10 corresponding to the first cavity part 71 and a portion of the container 10 corresponding to the second cavity part 72 are integrated through the partition plate 70.

The material of the partition plate 70 includes, for example, stainless, copper, a copper alloy such as cupronickel, aluminum, an aluminum alloy, iron, tin, nickel, a nickel alloy, titanium, and a titanium alloy.

In the heat insulating structure body 7, the first cavity part 71 and the second cavity part 72 are not in communication with each other through the partition plate 70. Each of the first cavity part 71 and the second cavity part 72 forms a closed space, and is evacuated to be kept under reduced pressure. In the heat insulating structure body 7, each of the first cavity part 71 and the second cavity part 72 is evacuated to produce a vacuum state.

The working fluid (not illustrated) is sealed in the second cavity part 72. Furthermore, the post parts 15 are disposed in the second cavity part 72. The post part 15 is, for example, a metal mesh, or a metal porous body made of a metal sintered body made by sintering metal powders such as copper powders. Accordingly, the post part 15 has a wick structure body causing a capillary force. As described above, the portion of the second cavity part 72 in the cavity part 13 of the container 10 functions as a cavity portion of the vapor chamber (planar heat pipe). Therefore, the portion between the second plate-like body 11 and the partition plate 70 functions as a container of the vapor chamber.

On the other hand, post parts 73 are provided in the first cavity part 71. The shape of the post part 73 is not limited to a particular shape, but in the heat insulating structure body 7, the post part 73 preferably has a shape extending from the partition plate 70 to the first plate-like body 12. The post parts 73 are members for keeping the first cavity part 71 under the reduced pressure. Therefore, portions other than the post parts 73 in the first cavity part 71 are space portions. The working fluid is not sealed in the first cavity part 71. Accordingly, the portion of the first cavity part 71 in the cavity part 13 of the container 10 functions as the heat insulating material. Therefore, the portion between the first plate-like body 12 and the partition plate 70 functions as a container of the heat insulating material. The first cavity part 71 is kept under reduced pressure, to thereby further improve the heat insulating property.

The material of the post part 73 is not limited to a particular material, and includes, for example, metal, and resin. More specifically, examples of the material of the post part 73 include a porous body made of metal or resin. Using the porous body makes it possible to reduce the weight of the post part 73 without compromising the mechanical strength. When the post part 73 is made of a metal mesh, a coarse mesh is preferably used to improve the heat insulating performance. Furthermore, when the post part 73 is made of a metal mesh and the post part 15 is also made of a metal mesh, it is preferable that an opening ratio of the mesh of the post part 73 is larger than that of the post part 15.

In the heat insulating structure body 7, the to-be-cooled body is thermally connected to an outer surface of the second plate-like body 11.

The materials of the first plate-like body 12 and the second plate-like body 11 include the above-described materials of the one plate-like body and the other plate-like body, but in the heat insulating structure body 7, the thermal conductivity of the second plate-like body 11 is higher than the thermal conductivity of the first plate-like body 12. More specifically, the material of the first plate-like body 12 is different from that of the second plate-like body 11. Accordingly, in the heating insulating structure body 7, the portion between the first plate-like body 12 and the partition plate 70 is improved in a function as a heat insulating material, and the portion between the second plate-like body 11 and the partition plate 70 is improved in the heat transfer function as a vapor chamber, that is, in the cooling performance.

Examples of the material of the second plate-like body 11 include copper, a copper alloy, aluminum, and an aluminum alloy. Examples of the material of the first plate-like body 12 include aluminum, an aluminum alloy, and stainless. The thickness of the second plate-like body 11 and the thickness of the first plate-like body 12 are not limited to particular values, and are preferably 0.05 to 1.0 mm, and particularly preferably 0.1 to 0.4 mm from the viewpoint of more surely keeping the cavity part under reduced pressure while exhibiting the excellent rigidity, in the similar manner as the one plate-like body and the other plate-like body which are described above.

Note that in the heat insulating structure body 7, the above-described first cavity part 71 is kept under reduced pressure, but need not be kept under reduced pressure if desired.

In the heat insulating structure body 7, the first cavity part 71 is provided in the container 10, thereby exerting the excellent heat insulating effect. Thus, the first cavity part 71 has the excellent heat insulating performance, thereby capable of preventing the heat from being transferred from the heating element (not illustrated) serving as a to-be-cooled body to a portion touched by a person or a portion on which a component vulnerable to heat is mounted, and thus enabling temperature increase of such a portion to be suppressed. In the heat insulating structure body 7, the post parts 15 functioning as a wick structure body are provided in the second cavity part 72 in the container 10, and the working fluid is sealed in the second cavity part 72 functioning as a vapor chamber, thereby having the excellent heat transfer properties, and thus enabling the excellent cooling effect to be exerted.

In the heating insulating structure body 7, a portion having the excellent heat insulating performance and a portion having the excellent heat transfer properties are integrated through the partition plate 70, and therefore the heat insulating structure body 7 is reduced in size such that the heat insulating structure body 7 can be installed in a narrow space.

Next, a heat insulating structure body according to an eighth embodiment of the present disclosure will be described with reference to the accompanying drawings. Note that the same reference numerals are used for the same components as the heat insulating structure bodies according to the first embodiment to the seventh embodiment.

Figure 10:
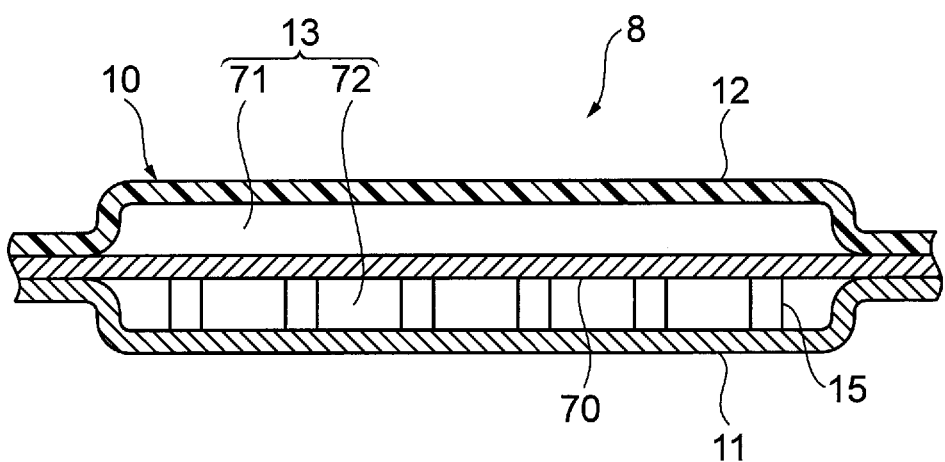
FIG. 10 is a diagram illustrating a heat insulating structure body according to an eighth embodiment of the present disclosure.

In the heat insulating structure body according to the seventh embodiment, the first plate-like body 12 is a metal member, and the first cavity part is kept under reduced pressure, and is provided with post parts 73. Alternatively, as illustrated in FIG. 10, in a heat insulating structure body 8 according to the eighth embodiment, the post part is not provided in the first cavity part 71, the first plate-like body 12 is made of resin, and the first cavity part 71 has no reduced pressure.

In the heat insulating structure body 8, the first plate-like body 12 is made of resin, thereby reducing the weight, and can be integrally formed by injection molding. In other words, the outer periphery of the container 10 can be formed without thermal welding, thereby facilitating manufacture of the heat insulating structure body 8.

Note that in the heat insulating structure body 8, in place of the above-described mode, if desired, the post part may be provided in the first cavity part 71, and the first cavity part 71 may have a reduced pressure.

Similar to the heat insulating structure body according to the seventh embodiment, the heat insulating structure body 8 has a portion having the excellent heat insulating performance and a portion having the excellent heat transfer properties, and both portions are integrated through the partition plate 70, such that the heat insulating structure body 8 can be installed in a narrow space.

Next, an example of a method of manufacturing the heat insulating material 1 used for the heat insulating structure bodies according to the above-described embodiments of the present disclosure will be described. The post parts 15 are placed on the one plate-like body 11, and the other plate-like body 12 is placed on the post parts 15, to thereby form a three-layer structure including the one plate-like body 11, the post parts 15, and the other plate-like body 12. At this time, the post parts 15 are housed in the cavity part 13, and a peripheral edge of the one plate-like body 11 and a peripheral edge of the other plate-like body 12 are disposed to overlap each other. Then, the peripheral edges of the one plate-like body 11 and the other plate-like body 12 facing each other are sealed by thermal welding. At this time, a part of the peripheral edge is not subjected to thermal welding, to form an opening for evacuating the internal space of the cavity part 13. The internal space of the cavity part 13 is evacuated through the opening, and the opening is sealed by thermal welding, to thereby manufacture the heat insulating material 1 in which the cavity part 13 has a reduced pressure.

Next, an example of a method of manufacturing the heat insulating structure body 6 according to the sixth embodiment of the present disclosure will be described. The post part 15 is inserted into the two metal plates 64, 65 facing each other, to form the three-layer structure. The peripheral edges of the two metal plates 64, 65 facing each other are sealed by thermal welding. At this time, a part of the peripheral edge is not subjected to thermal welding, to form an opening for injecting the working fluid. As illustrated in FIG. 8A, this opening is formed at one place of the other end 63 in the portion of the planar heat pipe 31. Then, the working fluid (e.g., water) is injected into a space formed between the two metal plates 64, 65 facing each other from the above-described opening. The center 61 is thermally welded, the space formed between the two metal plates 64, 65 facing each other is evacuated through the above-described opening, and the above-described opening is sealed by thermal welding. According to the above-described method, the heat insulating structure body 6 can be manufactured in which the working fluid is sealed in the portion of the planar heat pipe 31, and the working fluid is not sealed in the portion of the heat insulating material 1.

Figure 11:
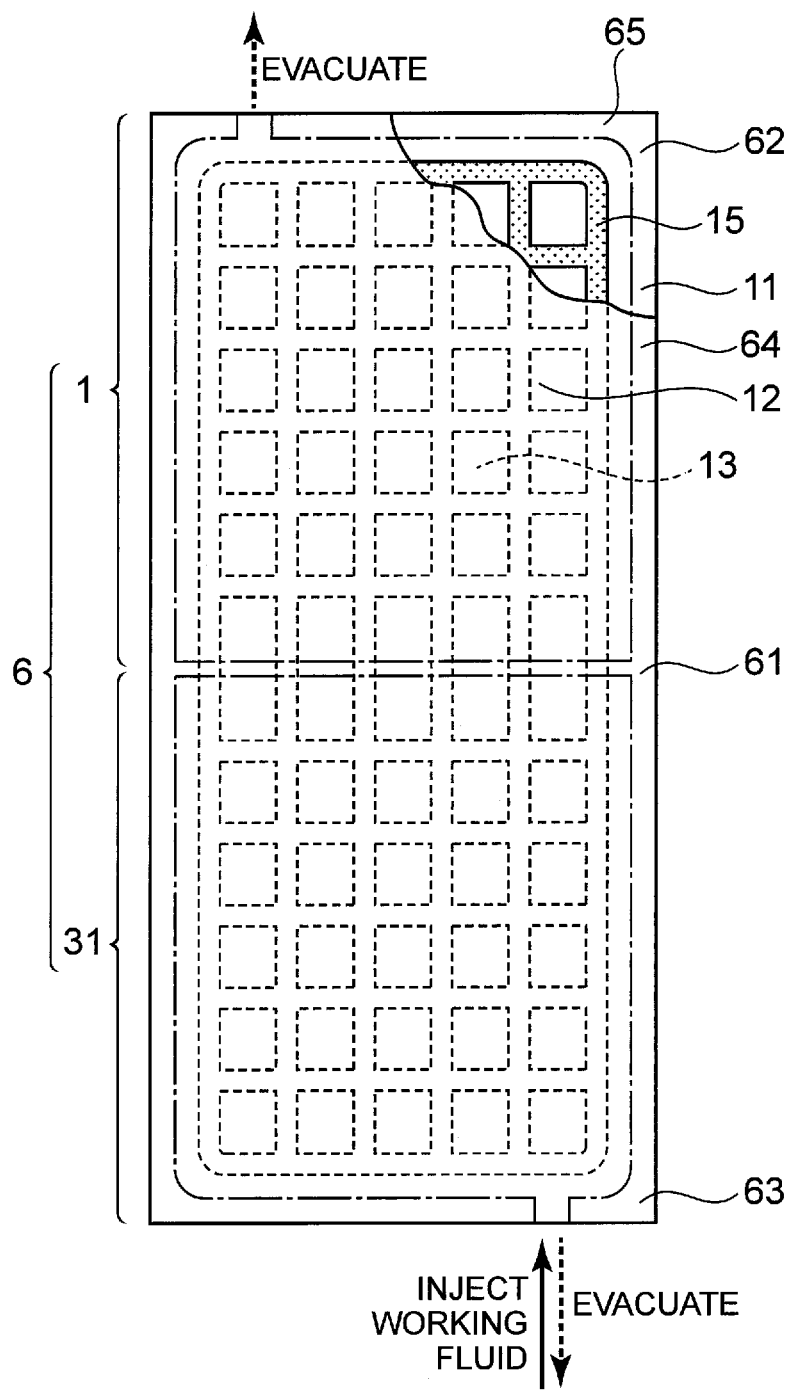
FIG. 11 is a diagram illustrating another method of manufacturing the heat insulating structure body according to the sixth embodiment of the present disclosure.

As another method of manufacturing the heat insulating structure body 6 according to the sixth embodiment of the present disclosure, as illustrated in FIG. 11, the openings may be provided at two places when the peripheral edges of the two metal plates 64, 65 facing each other are sealed by thermal welding. In FIG. 11, one opening is formed at the other end 63 in the portion of the planar heat pipe 31, and one opening is formed at the one end 62 in the portion of the heat insulating material 1. The center 61 is thermally welded, the working fluid (e.g., water) is injected into the space formed between the two metal plates 64, 65 through the opening at the other end 63 in the portion of the planar heat pipe 31, the space is evacuated, and then the opening at the other end 63 is sealed by thermal welding. At the opening at the one end 62 in the portion of the heat insulating material 1, the above-described center 61 is thermally welded, the space formed between the two metal plates 64, 65 is evacuated without the working fluid (e.g., water) being injected into the space, and the opening at the one end 62 is sealed by thermal welding. According to the above-described method, the heat insulating structure body 6 can be manufactured in which the working fluid is sealed in the portion of the planar heat pipe 31, and the working fluid is not sealed in the portion of the heat insulating material 1.

Next, regarding a heat insulating material used for a heat insulating structure body of the present disclosure, another embodiment will be described. In the heat insulating material according to the above-described embodiments, the post parts are disposed at both ends and center of the cavity part, but in place of this, the post parts may be disposed only at both ends of the cavity part, or the post part may be disposed only at center of the cavity part.

Next, regarding a heat insulating structure body of the present disclosure, another embodiment will be described. In the heat insulating structure body according to the first embodiment of the present disclosure, the heat dissipation fin serving as a heat exchanging unit is used, but in place of this, a heat sink may be used. In the heat insulating structure body according to the third embodiment of the present disclosure, another spacers are disposed between the circuit board and another heat insulating material, but the other spacers need not be disposed according to the usage state.

INDUSTRIAL APPLICABILITY

The heat insulating structure body of the present disclosure can exert the excellent heat insulating effect against the to-be-cooled body generating a larger amount of heat, and exert the excellent cooling effect by having the excellent heat transfer properties. Therefore, the heat insulating structure body can be used in a variety of fields, and has a high utility value, for example, in a field of cooling the electronic component mounted on the circuit board.

What is claimed is:

1. A heat insulating structure body comprising:
    a container which includes a first plate-like body, a second plate-like body facing the first plate-like body, a partition plate for dividing a space between the first plate-like body and the second plate-like body, a first cavity part formed by the first plate-like body and the partition plate, and a second cavity part formed by the second plate-like body and the partition plate,
    wherein a wick structure body and a working fluid are sealed in the second cavity part, the wick structure body is a metal mesh,
    a post part is provided in the first cavity part, the post part is a metal mesh, and
    an opening ratio of the post part is larger than that of the wick structure.

2. The heat insulating structure body according to claim 1, wherein the material of the first plate-like body is selected from the group consisting of aluminum, an aluminum alloy and stainless, the material of the second plate-like body is selected from the group consisting of copper, a copper alloy, aluminum and an aluminum alloy.

3. The heat insulating structure body according to claim 1, wherein
    each of the first plate-like body, the second plate-like body, and the partition plate is one metal plate-like body, and the first plate-like body, the second plate-like body, and the partition plate are integrally formed by thermal welding.

4. The heat insulating structure body according to claim 1, wherein
    a thermal conductivity of the second plate-like body is higher than a thermal conductivity of the first plate-like body.

5. The heat insulating structure body according to claim 1, wherein
    the first cavity part has a reduced pressure.

6. The heat insulating structure body according to claim 1, wherein
    the first plate-like body is made of a thermoplastic resin.

* * * * *